US011599438B1

(12) United States Patent
Shani

(10) Patent No.: US 11,599,438 B1
(45) **Date of Patent: *Mar. 7, 2023**

(54) SYSTEM, METHOD, AND COMPUTER PROGRAM FOR COMBINING RESULTS OF EVENT PROCESSING RECEIVED FROM A PLURALITY OF VIRTUAL SERVERS

(71) Applicants: Amdocs Software Systems Limited, Dublin (IE); Amdocs Development Limited, Limassol (CY)

(72) Inventor: Omer Shani, Savyon (IL)

(73) Assignee: AMDOCS DEVELOPMENT LIMITED, Limassol (CY)

(*) Notice: Subject to any disclaimer, the term of this patent is extended or adjusted under 35 U.S.C. 154(b) by 39 days.

This patent is subject to a terminal disclaimer.

(21) Appl. No.: 15/357,981

(22) Filed: Nov. 21, 2016

Related U.S. Application Data

(63) Continuation of application No. 14/465,709, filed on Aug. 21, 2014, now Pat. No. 9,501,302, which is a continuation-in-part of application No. 12/135,001, filed on Jun. 6, 2008, now Pat. No. 8,850,458.

(51) Int. Cl.
*G06F 11/263* (2006.01)
*G06F 11/22* (2006.01)

(52) U.S. Cl.
CPC ........ *G06F 11/263* (2013.01); *G06F 11/2268* (2013.01)

(58) Field of Classification Search
None
See application file for complete search history.

(56) References Cited

U.S. PATENT DOCUMENTS

| | | | | |
|---|---|---|---|---|
| 7,031,868 | B2 * | 4/2006 | Yeung | G01R 31/31855 702/120 |
| 7,334,162 | B1 | 2/2008 | Vakrat et al. | |
| 7,463,648 | B1 * | 12/2008 | Eppstein | G06F 9/5011 370/468 |
| 7,826,378 | B2 * | 11/2010 | Absillis | H04B 10/0793 370/241 |
| 2001/0047406 | A1 | 11/2001 | Araujo et al. | |
| 2001/0049741 | A1 * | 12/2001 | Skene | G06F 9/505 709/232 |
| 2003/0233385 | A1 * | 12/2003 | Srinivasa | G06F 9/466 718/1 |
| 2003/0236848 | A1 * | 12/2003 | Neiman | G06F 9/505 709/213 |

(Continued)

OTHER PUBLICATIONS

Gewaltig et al., "NEST (Neural Simulation Tool") (available at: https://web.archive.org/web/20080505234414/http://www.scholarpedia.org/article/NEST_%28NEural_Simulation_Tool%29). (Year: 2007).*

(Continued)

*Primary Examiner* — S. Sough
*Assistant Examiner* — Phuong N Hoang
(74) *Attorney, Agent, or Firm* — Zilka-Kotab, P.C.

(57) ABSTRACT

A system, method, and computer program are provided for combining results of event processing received from a plurality of virtual processes or servers. In use, an event is sent to a plurality of virtual processes or virtual servers. Further, a result of processing of the event is received from each of the virtual processes or virtual servers. In addition, the results received from the plurality of virtual processes or virtual servers are combined.

11 Claims, 7 Drawing Sheets

400
TEST SERVER 402
SERVER 2
SERVER 1
SERVER 5
404
406
408
SERVER 3
SERVER 4
410
412

(56) References Cited

U.S. PATENT DOCUMENTS

2004/0003070 A1* 1/2004 Fernald .................. H04L 43/00 709/223
2004/0199815 A1 10/2004 Dinker et al.
2005/0044443 A1 2/2005 Magnaghi et al.
2005/0120160 A1* 6/2005 Plouffe .................. G06F 9/505 711/1
2005/0159982 A1 7/2005 Showalter et al.
2005/0193088 A1* 9/2005 Dittrich ............... G06F 16/2471 709/217
2007/0033441 A1* 2/2007 Sathe ..................... G06F 11/36 714/38.14
2007/0214391 A1* 9/2007 Castro .................. G06F 11/368 714/38.14
2008/0049786 A1* 2/2008 Ram .................... G06F 9/5083 370/468
2008/0063003 A1* 3/2008 O'Neal ............... H04L 12/1854 370/408
2008/0209039 A1* 8/2008 Tracey .................... H04L 67/28 709/225
2008/0219171 A1* 9/2008 Gopalakrishna .......... H04J 3/14 370/241.1
2008/0235378 A1 9/2008 Fried et al.
2008/0235633 A1* 9/2008 Ghiloni ............... G06F 11/3676 715/862
2008/0295064 A1* 11/2008 Mitra ........................ G06F 8/20 717/100
2009/0070786 A1* 3/2009 Alves ...................... G06F 9/541 719/318
2009/0089544 A1* 4/2009 Liu .......................... G06F 8/45 712/30
2009/0183152 A1* 7/2009 Yang .................... G06F 9/5072 718/1

OTHER PUBLICATIONS

Non-Final Office Action from U.S. Appl. No. 14/465,709, dated Mar. 19, 2015.
Non-Final Office Action from U.S. Appl. No. 14/465,696, dated Apr. 10, 2015.

* cited by examiner

SYSTEM, METHOD, AND COMPUTER PROGRAM FOR COMBINING RESULTS OF EVENT PROCESSING RECEIVED FROM A PLURALITY OF VIRTUAL SERVERS

CLAIM OF PRIORITY

This application is a continuation of U.S. application Ser. No. 14/465,709, filed Aug. 21, 2014, which is a continuation in part of U.S. application Ser. No. 12/135,001, filed Jun. 6, 2008, the entire contents of which are incorporated herein by reference.

FIELD OF THE INVENTION

The present invention relates to event processing, and more particularly to results of event processing.

BACKGROUND

Traditionally, event processing has included processing any types of data, instructions, functions, etc. However, techniques for generating results of the event processing have generally been limited. For example, event processing has sometimes been utilized for function testing purposes.

Customarily, a fault within a function has been detected by utilizing a function test. Just by way of example, the function test utilizes a function to generate an output based on a known input. Further, the output is evaluated against known output. In addition, if the output matches the known output, then the function passes the function test. Additionally, if the output does not match the known output, then the function fails the function test. To this end, utilizing such traditional function testing has generally only been suitable when the path through a set of functions is constant. However, in the case where the path of the set of functions is not constant, utilization of such a function test has failed to indicate which particular function has failed. As an example, this case is especially true in environments where debugging facilities are unavailable, such as in production environments.

Furthermore, built-in-tests are traditionally utilized in embedded software environments in order to ensure the correct behavior of a component, a function, or a process. Still yet, in the built-in-tests standard practices, a test is deployed against a single function, otherwise, there may be an ambiguity as to what function malfunctions.

There is thus a need for addressing these and/or other issues associated with the prior art.

SUMMARY

A system, method, and computer program are provided for combining results of event processing received from a plurality of virtual processes or servers. In use, an event is sent to a plurality of virtual processes or virtual servers. Further, a result of processing of the event is received from each of the virtual processes or virtual servers. In addition, the results received from the plurality of virtual processes or virtual servers are combined.

DETAILED DESCRIPTION

Figure 1:
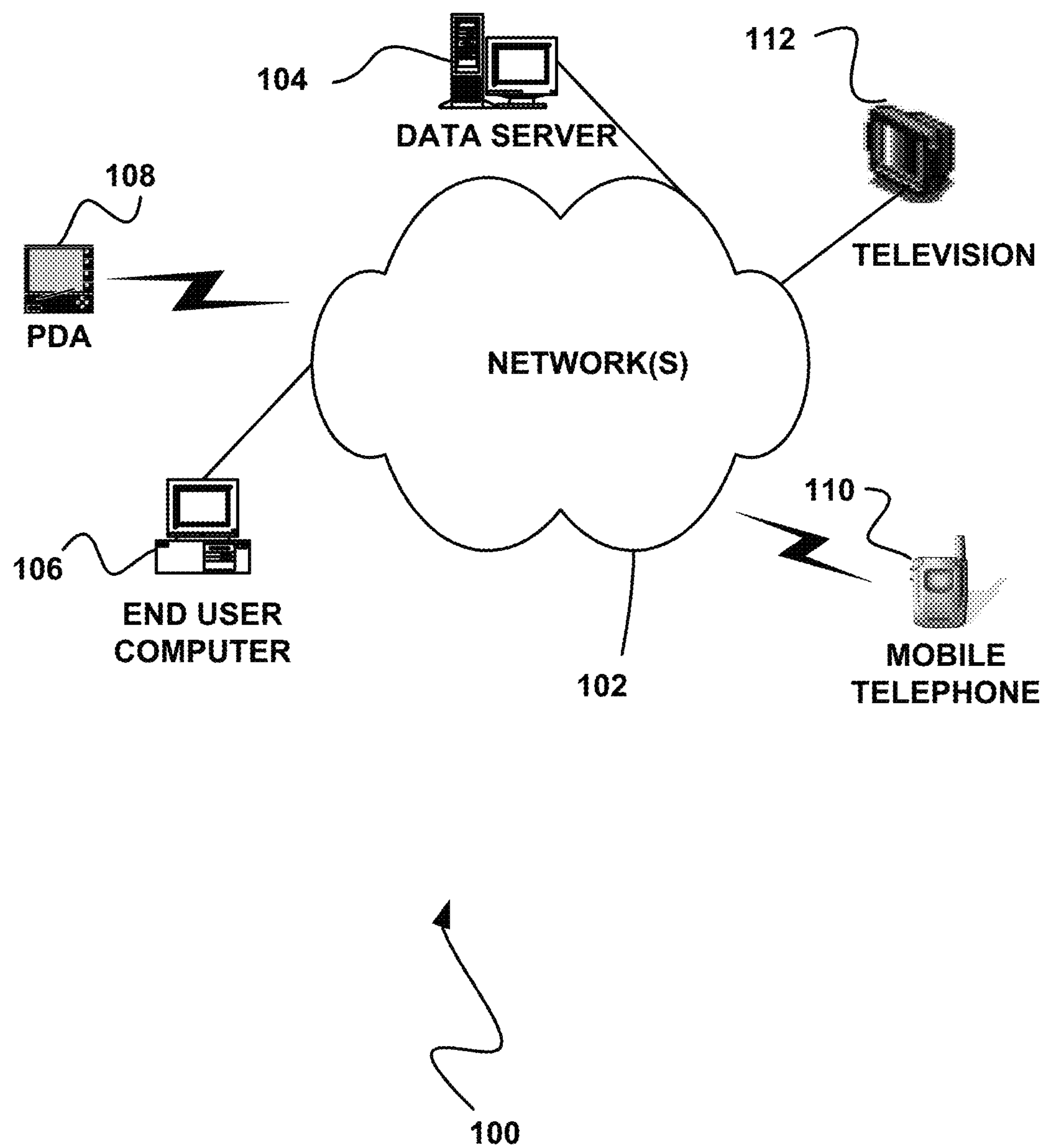
FIG. 1 illustrates a network architecture, in accordance with one possible embodiment.

FIG. 1 illustrates a network architecture 100, in accordance with one possible embodiment. As shown, at least one network 102 is provided. In the context of the present network architecture 100, the network 102 may take any form including, but not limited to a telecommunications network, a local area network (LAN), a wireless network, a wide area network (WAN) such as the Internet, peer-to-peer network, cable network, etc. While only one network is shown, it should be understood that two or more similar or different networks 102 may be provided.

Coupled to the network 102 is a plurality of devices. For example, a server computer 104 and an end user computer 106 may be coupled to the network 102 for communication purposes. Such end user computer 106 may include a desktop computer, lap-top computer, and/or any other type of logic. Still yet, various other devices may be coupled to the network 102 including a personal digital assistant (PDA) device 108, a mobile phone device 110, a television 112, etc.

Figure 2:
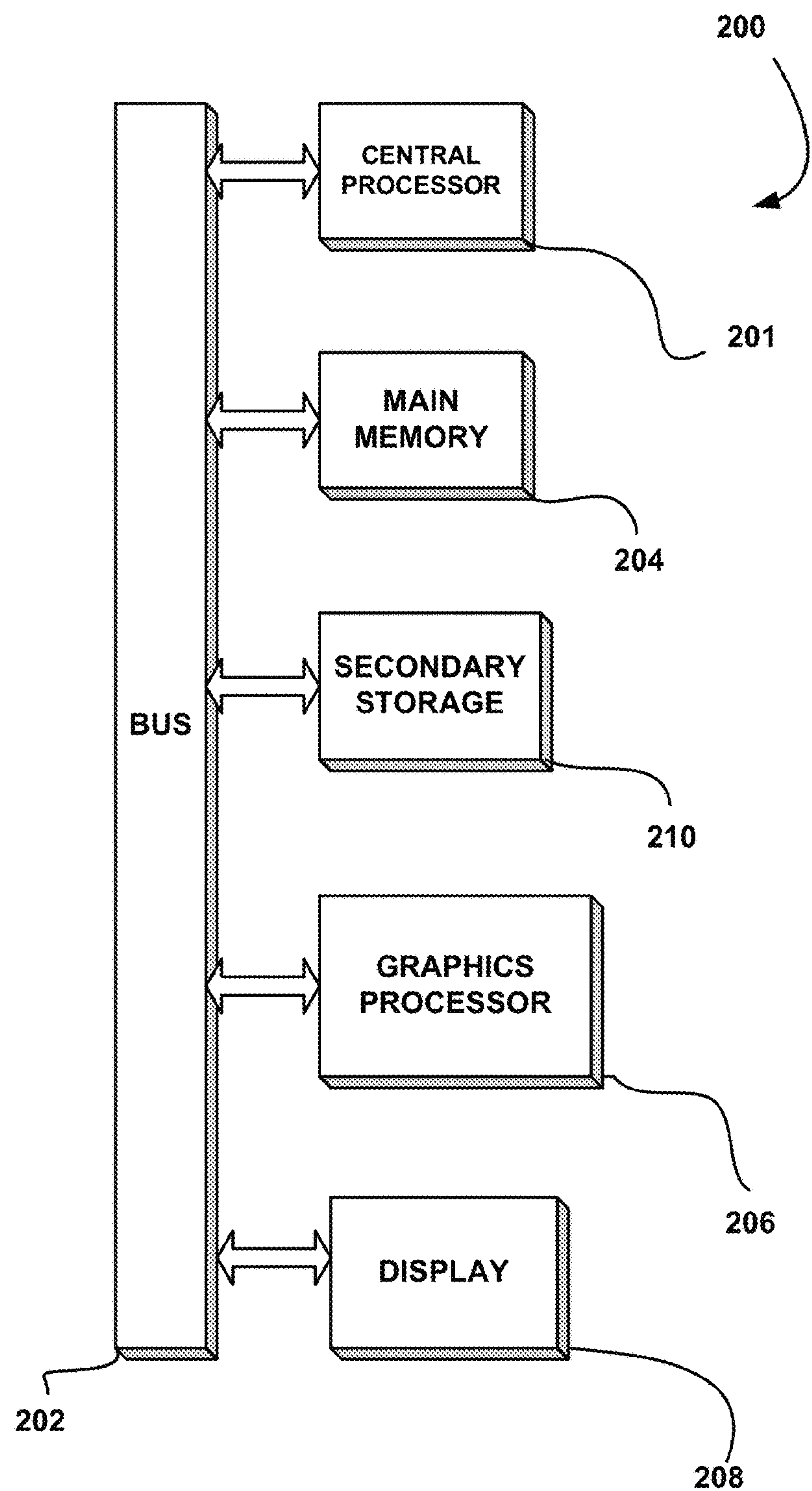
FIG. 2 illustrates an exemplary system, in accordance with one embodiment.

FIG. 2 illustrates an exemplary system 200, in accordance with one embodiment. As an option, the system 200 may be implemented in the context of any of the devices of the network architecture 100 of FIG. 1. Of course, the system 200 may be implemented in any desired environment.

As shown, a system 200 is provided including at least one central processor 201 which is connected to a communication bus 202. The system 200 also includes main memory 204 [e.g. random access memory (RAM), etc.]. The system 200 also includes a graphics processor 206 and a display 208.

The system 200 may also include a secondary storage 210. The secondary storage 210 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 204 and/or the secondary storage 210. Such computer programs, when executed, enable the system 200 to perform various functions (to be set forth below, for example). Memory 204, storage 210 and/or any other storage are possible examples of computer-readable media.

Figure 3:
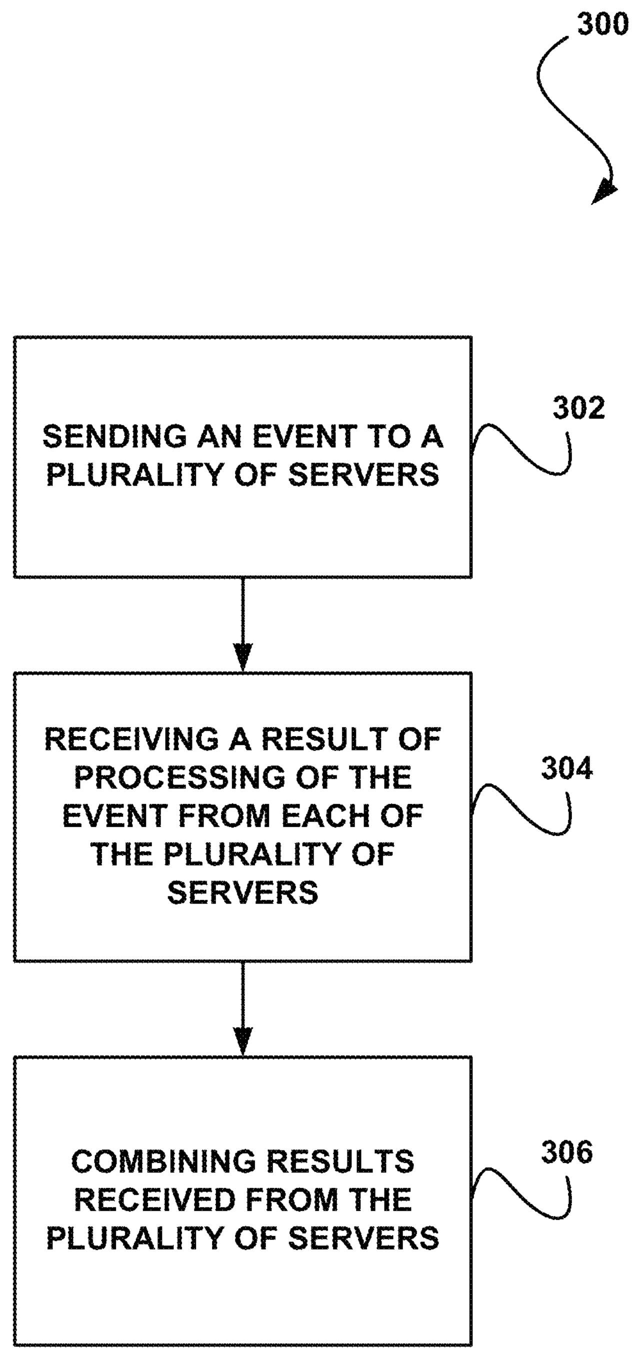
FIG. 3 illustrates a method for combining results of event processing received from a plurality of servers, in accordance with another embodiment.

FIG. 3 illustrates a method 300 for combining results of event processing received from a plurality of servers, in accordance with one embodiment. As an option, the method 300 may be carried out in the context of the details of FIGS. 1 and/or 2. Of course, however, the method 300 may be carried out in any desired environment. Further, the aforementioned definitions may equally apply to the description below.

As shown in operation 302, an event is sent to a plurality of servers. In the context of the present description, the event may include any data capable of being sent to the plurality of servers. As an option, the event may include an external message sent to the servers. Further, as yet another option, the external message may include a request, a command, an instruction, information, etc. In addition, as still yet another option, the event may include a data structure capable of being utilized by the servers. For example, the servers may utilize the event as a structured diagnosis tool.

Further, in one embodiment, sending the event may include communicating, transferring, forwarding, routing, etc. the event. As an option, the event may be sent utilizing a network. Optionally, the event may utilize a network protocol from an Internet protocol suite. For example, the Internet protocol suite may include a transmission control protocol (TCP), a user datagram protocol (UDP), an Internet protocol (IP), etc.

Further, in one embodiment, the event may be sent to the plurality of servers as a batch. Optionally, the batch may include a separate event for each server in the plurality of servers. For example, the number of separate events in the batch may be equal to the number of servers.

In another embodiment, the event may be sent by another server. As an option, the other server may include a test server, a management server, a diagnostic server, etc. Further, as yet another option, the other server may send the event in response to a request. For example, after receiving a request, the test server may send the event to each server in the plurality of servers.

Additionally, in yet another embodiment, the plurality of servers may include any number of servers capable of receiving an event. Optionally, the receiving may include accepting, catching, getting, etc. As an option, the servers may each include a network management system (NMS) server, an alert server, a monitoring server, a database server, an email server, a web server, an access server, etc.

In still yet another embodiment, each server may include a set of functions. As an option, the set of functions may be utilized to process the event. Further, as yet another option, the set of functions may include any number of functions capable of being utilized for processing the event. Optionally, each server may include the same set of functions as the other servers. For example, each server may include a set of functions identical to the set of functions on the other servers.

Further, in one embodiment, each function in the set of functions may be utilized to process the event. As another option, the processing may include utilizing the event as an input to the function. Further, as yet another option, the processing may include producing a result based on the input. For example, the function may utilize instructions and/or data associated with the event as input, and may produce the result based on the event.

In addition, in one embodiment, the sending of the event may initiate processing of the event. Optionally, the event batch sent to the servers may initiate processing of the event on each of the servers. As yet another option, the processing of the event on each server may be initiated after the server receives the event.

Additionally, in another embodiment, the processing of the event may utilize the set of functions. Optionally, the event may be utilized as an input to a first function of the set of functions. As another option, the first function may generate the result based on the input. For example, the first function may generate an intermediate result based on the event utilized as the input to the first function.

In yet another embodiment, the intermediate result from the first function may be sent to a second function of the set of functions. Optionally, the second function may utilize the intermediate result from the first function as an input to the second function. Thus, as one option, the intermediate result from a previous function may be used as the input to a next function of the set of functions.

Furthermore, in still yet another embodiment, a last function of the set of functions may utilize the intermediate result from the previous function as the input to the last function. Optionally, the last function may generate a final result of the processing of the event. As yet another option, the final result may be sent to the other server that sent the event to the server. Further, as one option, the final result may be sent to any server, device, client, etc.

In one embodiment, the processing of the event may include cross server processing. Optionally, the cross server processing may include performing the first function on a first one of the servers, and then performing the second function on a second one of the servers. As an option, the cross server processing may be performed in a slanted direction from one server to the next server or previous server. Furthermore, as still yet another option, the event may indicate the direction and/or order of the processing. Additionally, as an option, the direction and/or the order of the processing may be utilized to determine the next server and/or the previous server.

Additionally, in another embodiment, the cross server processing may include performing the processing of the event in a first direction. For example, the cross server processing may include sending the intermediate result of the first function to the next function on the next server. Further, in yet another embodiment, the cross server processing may include performing the processing of the event in a second direction opposite to the first direction. As another example, the cross server processing may include sending the intermediate result of the first function to the next function on the previous server.

Further, a result of processing of the event is received from each of the servers, as shown in operation 304. As an option, the result received from each of the servers may include a final result. Optionally, the final result may include the result from the last function of the set of functions. Additionally, as yet another option, the result may include any data sent from each of the servers that is associated with the processing of the event.

In addition, in yet another embodiment, after receiving the result of the processing of the event from each of servers, another event may be sent to the servers. Sending the other event may initiate processing of the other event on each of the servers. Further, as an option, the other event may indicate that the direction and/or order of the processing should be performed opposite to the direction and/or order of the event. Thus, the processing of a first event may be performed in a first direction, and the processing of a second event may be performed in a second direction opposite to the first direction. For example, the processing of the first event may be performed in a first direction from the first server to the second server, and the processing of the other event may be performed in a second direction from the first server to a last server, which is opposite to the first direction.

Additionally, in still yet another embodiment, the processing of the other event may generate another result. Optionally, the other result of the processing of the other event may be received from each of the servers. Further, as another option, the other result of the processing may include the final result of the processing of the other event.

In addition, the results received from the plurality of servers are combined. See operation 306. Optionally, the results received may include the results associated with the event, and/or the other results associated with the other event. For example, the results may include the result received from each of the servers and the other result received from each of the servers.

Furthermore, in one embodiment, the combining may include summing the results. As an option, the combining may include summing the results associated with the event and/or the other results associated with the other event. Optionally, the combining may include summing the result associated with the event and the other result associated with the other event for each server. Further, as yet another option, the combining may generate a combined result associated with each server. Still yet as another option, the combining may generate the combined result associated with the event batch.

In another embodiment, the combined results may be utilized to identify a malfunctioning function. As an option, the malfunctioning function may be identified based on the combined results. Optionally, based on the combined results, the malfunctioning function may be identified as having processed both the event and the other event. Further, as yet another option, based on the combined results, the malfunctioning function may be identified as being associated with a particular server.

To this end, sending the event to the plurality of servers and combining the results received from the plurality of servers may be utilized to identify the malfunctioning function. Thus, by combining the results associated with the event and the other event, the malfunctioning function may be accurately identified. For example, by combining first results received in response to a first event sent in a first batch with second results received in response to a second event sent in a second batch, the malfunctioning function may be identified in an efficient and accurate manner.

In still yet another optional embodiment, a set of pre-planned events (e.g. BIT events) may be sent to a plurality of servers. Further, a result of processing of the pre-planned events from a plurality of functions may be received from the plurality of servers. Optionally, the result may enable an identification of any malfunction. In addition, as yet another option, the results received from the plurality of servers may be combined to create a status of the plurality of servers.

More illustrative information will now be set forth regarding various optional architectures and uses in which the foregoing method may or may not be implemented, per the desires of the user. It should be strongly noted that the following information is set forth for illustrative purposes and should not be construed as limiting in any manner. Any of the following features may be optionally incorporated with or without the exclusion of other features described.

Figure 4:
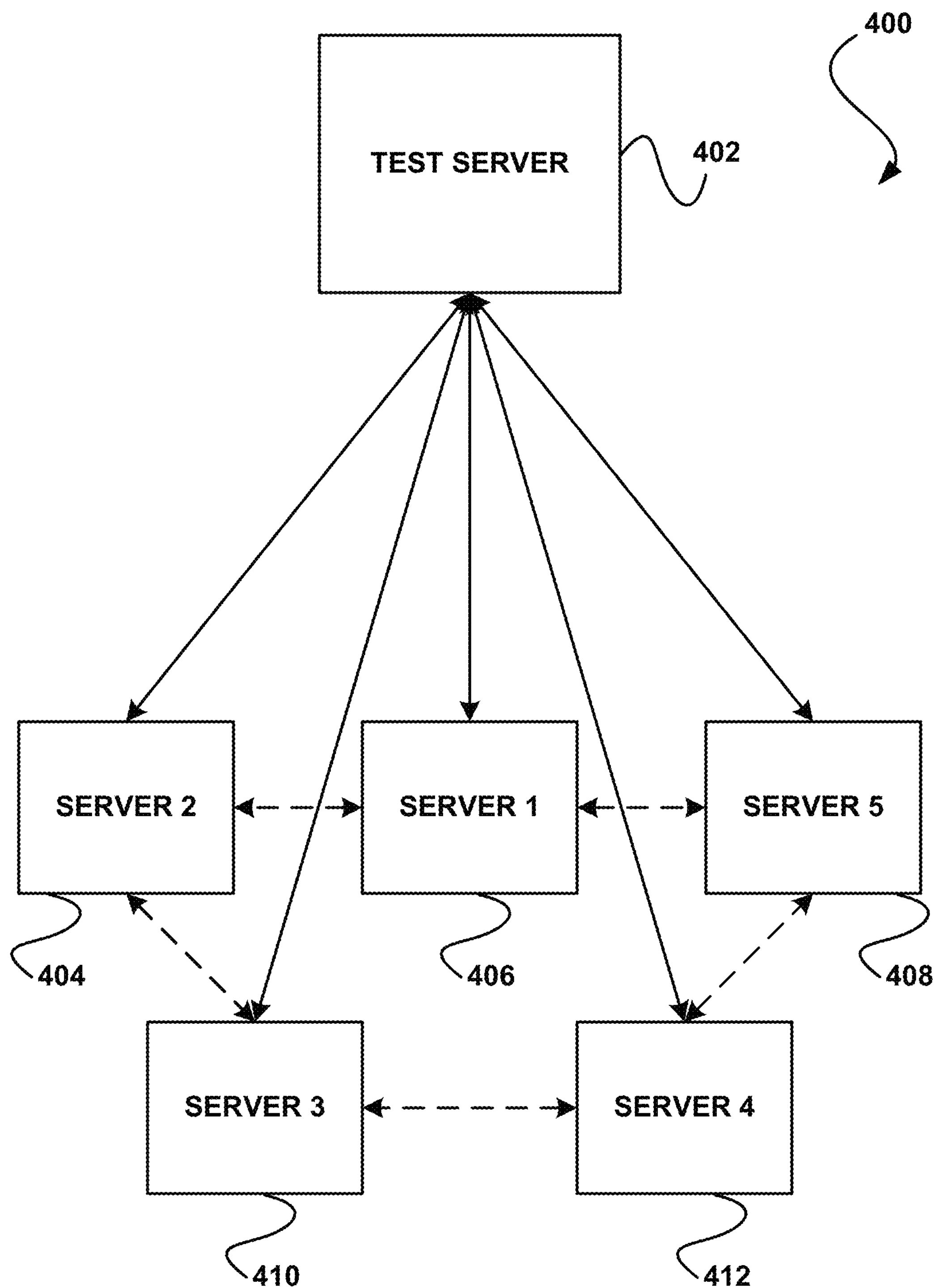
FIG. 4 illustrates a system for combining results of event processing received from a plurality of servers, in accordance with yet another embodiment.

FIG. 4 illustrates a system 400 for combining results of event processing received from a plurality of servers, in accordance with yet another embodiment. As an option, the system 400 may be implemented in the context of the details of FIGS. 1-3. Of course, however, the system 400 may be implemented in any desired environment. Further, the aforementioned definitions may equally apply to the description below.

In one embodiment, a test server 402 may send a first event batch to a set of servers 404-412. As an option, the first event batch may include a first event for each server in a set of servers 404-412. As an option, the set of servers 404-412 may not be limited to the five servers as illustrated, but may include any desired number of servers. Optionally, the test server 402 may include any device capable of sending the first event to the servers 404-412. For example, the test server 402 may send the first event associated with the first batch to each server in the set of servers 404-412.

Additionally, in another embodiment, each server in the set of servers 404-412 may receive the first event from the test server. In addition, as another option, after receiving the first event, each server may process the event. Optionally, the first event may be processed utilizing a first function in a set of functions. As yet another option, the set of functions may be included on each server. Further, as one option, the first function may generate a first result based on the processing of the first event.

In addition, in yet another embodiment, after processing the first event utilizing the first function, each server may determine which other server to send the first result. Optionally, a direction to send a result may be indicated by the first event. For example, the first event may indicate that the result should be sent to a next function on a next server. As yet another example, the first event may indicate that the result should be sent to the next function on a previous server. To this end, the servers 404-412 may be ordered.

Just by way of example, a first server 406 may send the result to a second server 404 or a fifth server 408 (e.g. the last server). In addition, in one embodiment, the second server 404 may send the result to a third server 410 or the first server 406. As another embodiment, the third server 410 may send the result to a fourth server 412 or the second server 404. Further, as yet another embodiment, the fourth server 412 may send the result to the fifth server 408 or the third server 410. Furthermore, as still yet another embodiment, the fifth server 408 may send the result to the first server 406 or the fourth server 412.

In one embodiment, the result from each function of the set of functions may be sent as an input to the next function. As an option, the result may include a previous result from at least one previous function. Optionally, if function includes the last function, then the result may be sent to the test server 402. For example, after the last function processes the result received from a previous function, then the last function may send a final result to the test server 402.

In another embodiment, the test server 402 may receive the final result associated with the first event from each of the servers. As an option, after receiving the final result associated with the first event, the test server 402 may send a second event to each server in a set of servers 404-412. Optionally, the second event may indicate that the result of processing the second event should be sent in a second direction, where the second direction is opposite to the direction indicated by the first event. For example, if the first event indicated that a result should be sent to a next server, the second event may indicate that a result should be sent to a previous server.

Further, in yet another embodiment, the last function may send the final result associated with the second event to the test server 402. Optionally, the final result may include the final result of the processing of the second event in the second direction. In still yet another embodiment, the test server 402 may receive the final result associated with the second event from each of the servers 404-412.

Additionally, in another embodiment, the final result from each server in the set of servers 404-412 that is associated with the first event and/or the second event may be compared against an expected result associated with the processing of the first event and/or the second event. As an option, if the final result matches the expected result, then the final result may be indicated as a success. As another option, if the final result does not match the expected result, then the final result may be indicated as a failure.

In still yet another embodiment, the test server 402 may combine the final results received from the set of servers. As an option, the test server 402 may combine the final result received from each server in the set of servers 404-412 that is associated with the first event and the second event. As another option, the test server 402 may combine the final results associated with the first event batch received from each server in the set of servers 404-412. Optionally, the test server 402 may combine the final results associated with the second batch received from each server in the set of servers 404-412.

Furthermore, in one embodiment, a malfunctioning function may be identified utilizing the test server 402 based on the combination of the final results. Optionally, the malfunctioning function may produce a result that is different from a result produced by a normally operating function. For example, the normally operating function F1 may produce an expected result given an input, and the malfunctioning function F1 may produce an unexpected result given the same input.

In addition, in another embodiment, the malfunctioning function may be identified by a combination of the final results that are indicated as a failure. Optionally, for each final result indicated as a failure, each server in the set of servers 404-412 and/or associated function utilized to process the event may be identified. As an option, each server in the set of servers 404-412 and associated function may be identified based on a number of functions and a number of servers in the set of servers 404-412 that are associated with a particular processing direction that generated the final result indicated as a failure.

Furthermore, as another option, all the servers in the set of servers 404-412 and functions associated with each final result indicated as a failure are identified. In addition, by combining the servers 404-412 and functions, the malfunctioning function may be identified via the server 404-412 and associated function identified by each final result. For example, if a third function on the fourth server 412 is malfunctioning, then the third function on the fourth server 412 may be identified as having processed the event associated with the failed result for each direction.

Additionally, as yet another example, if a ninth function on a sixth server (not shown) is malfunctioning, then the ninth function on the sixth server will have processed the event in the first direction and in the second direction. Further, in the context of the current example, the ninth function on the sixth server may be associated with a first failed result and the second failed result, and therefore, may be identified as malfunctioning based on the combination of the results.

Figure 5A:
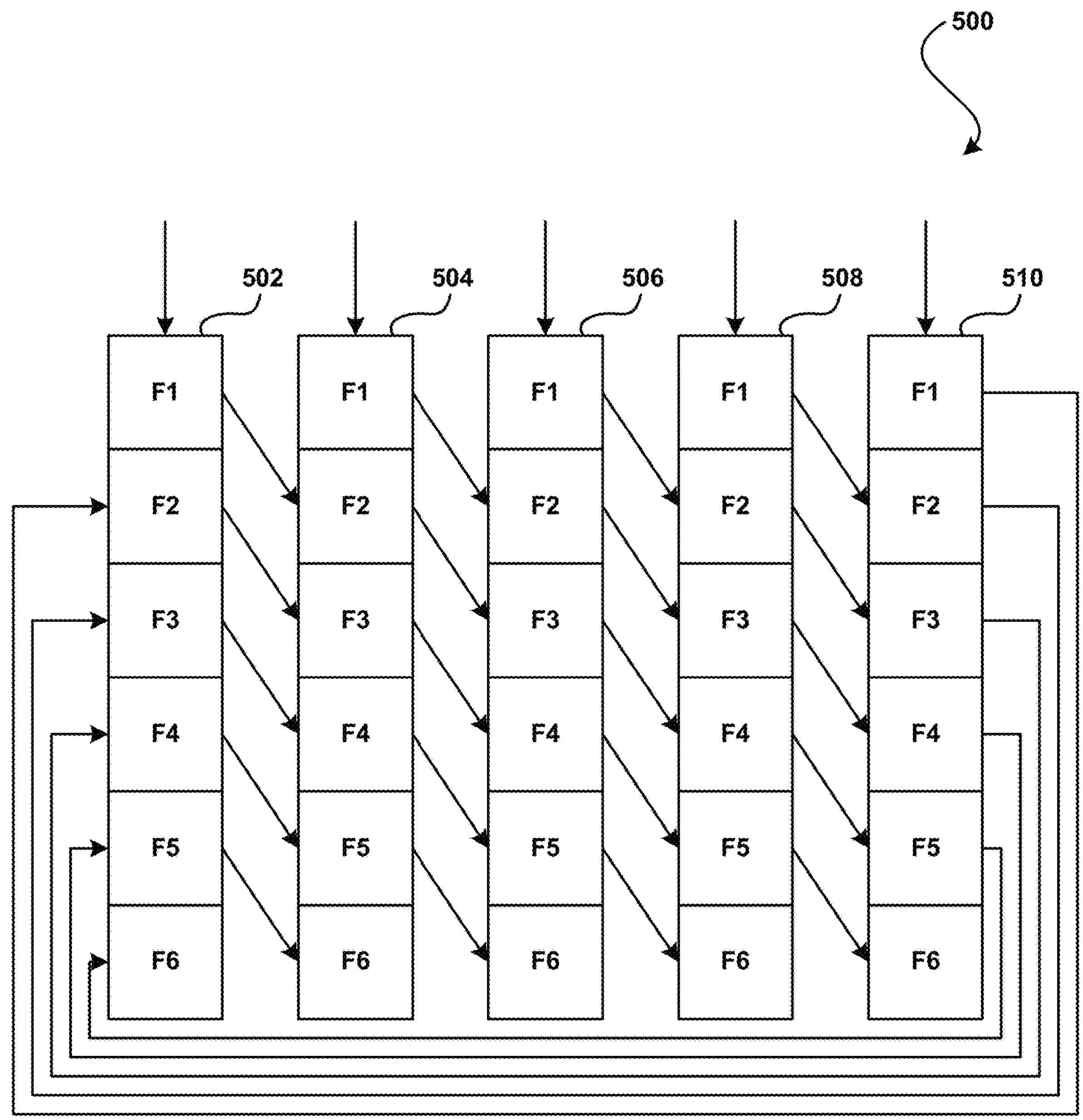
FIG. 5A illustrates a system for performing a function test for each function of a set of functions utilizing a plurality of servers, in accordance with still yet another embodiment.

FIG. 5A illustrates a system 500 for performing a function test for each function of a set of functions utilizing a plurality of servers, in accordance with still yet another embodiment. As an option, the system 500 may be implemented in the context of the details of FIGS. 1-4. Of course, however, the system 500 may be implemented in any desired environment. Further, the aforementioned definitions may equally apply to the description below.

In one embodiment, a set of servers may include a set of functions on each server. As an option, each server may include the same set of functions as the other servers in the set of servers. Optionally, these functions may be utilized to process an input and/or produce an output.

In another embodiment, an event may be sent to each server in the set of servers. As an option, the event may be included in a batch of events. For example, the event may be sent to a first server 502, a second server 504, a third server 506, a fourth server 508, and a fifth server 510. Optionally, a direction to which to send a result of processing of the event may be indicated by the event. With respect to the present embodiment, the direction of the processing may indicate that a server should send a result to a next server, based on an ordering of the servers.

Further, in one embodiment, the first server 502 may receive the event. As an option, the event may be processed by a first function (e.g. F1) on the first server 502. Further, as yet another option, a first result of the processing may be generated by the first function. As still yet another option, the first server 502 may send the first result to a second function (e.g. F2) on the second server 504.

Additionally, in another embodiment, the second server 504 may receive the first result from the first server 502, based on the direction indicated by the event. As an option, the first result may be processed by the second function on the second server 504. Further, as yet another option, a second result of the processing may be generated by the second function. As still yet another option, the second server 504 may send the second result to a third function (e.g. F3) on the third server 506.

In addition, in yet another embodiment, the third server 506 may receive the second result from the second server 504. As an option, the second result may be processed by the third function on the third server 506. Further, as yet another option, a third result of the processing may be generated by the third function. As still yet another option, the third server 506 may send the third result to a fourth function (e.g. F4) on the fourth server 508.

Furthermore, in still yet another embodiment, the fourth server 508 may receive the third result from the third server 506. As an option, the third result may be processed by the fourth function on the fourth server 508. Further, as yet another option, a fourth result of the processing may be generated by the fourth function. As still yet another option, the fourth server 508 may send the fourth result to a fifth function (e.g. F5) on the fifth server 510.

Further, in one embodiment, the fifth server 510 may receive the fourth result from the fourth server 508. As an option, the fourth result may be processed by the fifth function on the fifth server 510. Further, as yet another option, a fifth result of the processing may be generated by the fifth function. As still yet another option, the fifth server 510 may send the fifth result to a sixth function (e.g. F6) on the first server 502.

Additionally, in another embodiment, the first server 502 may receive the fifth result from the fifth server 510. As an option, the fifth result may be processed by the sixth function on the first server 502. Further, as yet another option, a sixth result of the processing may be generated by the sixth function. As still yet another option, since the sixth function is the last function, as illustrated, then the sixth result may be the final result for the processing flow of the event initially received at the first server 502. Additionally, as another option, the final result may be sent to a processing server. For example, the processing server may have sent the event to the first server 502.

In addition, in yet another embodiment, a similar processing flow is performed for the events received at the second server 504, the third server 506, the fourth server

508, and the fifth server 510. For example, the sixth functions of each server may generate the final result of processing for the received event. As yet another example, if the third function of the fourth server 508 is malfunctioning, then the final result generated by the sixth function of the second server 504 may be different than the final results generated by the sixth function of the other servers.

Figure 5B:
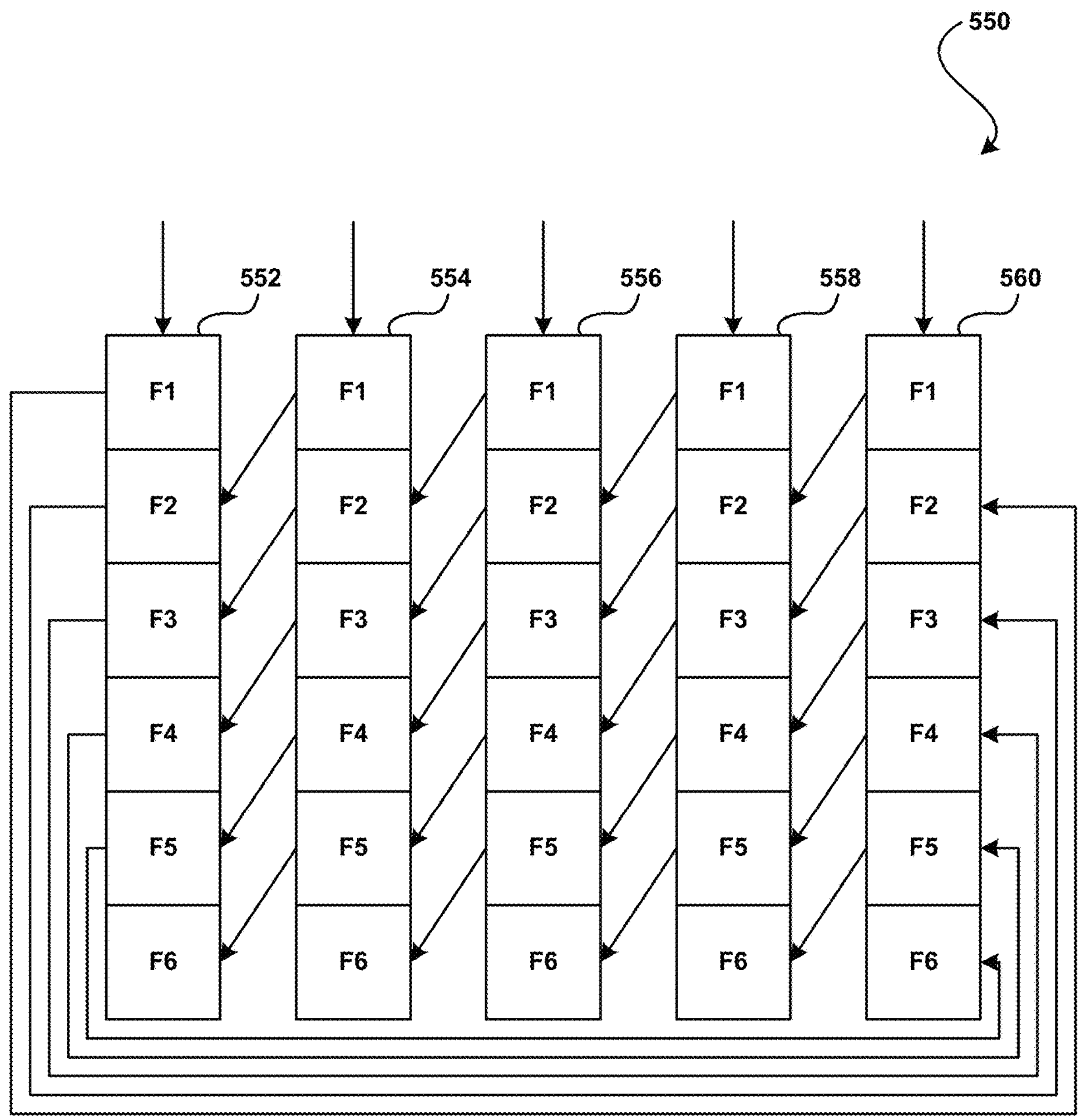
FIG. 5B illustrates a system for performing a function test for each function of a set of functions utilizing a plurality of servers, in accordance with another embodiment.

FIG. 5B illustrates a system 550 for performing a function test for each function of a set of functions utilizing a plurality of servers, in accordance with another embodiment. As an option, the system 550 may be implemented in the context of the details of FIGS. 1-5A. Of course, however, the system 550 may be implemented in any desired environment. Further, the aforementioned definitions may equally apply to the description below.

In one embodiment, a set of servers may include a set of functions on each server. As an option, each server may include the same set of functions as the other servers. Optionally, these functions may be utilized to process an input and/or produce an output.

In another embodiment, an event may be sent to each server in the set of servers. As an option, the event may be included in a batch of events. For example, the event may be sent to a first server 552, a second server 554, a third server 556, a fourth server 558, and a fifth server 560. Optionally, a direction to which to send a result of processing of the event may be indicated by the event. With respect to the present embodiment, the direction of the processing may indicate that a server should send a result to a previous server, based on an ordering of the servers. As an example, the event may be associated with a second batch of events, such that the direction of the processing may be indicated as a direction opposite of a direction of the processing for a first batch of events (e.g. opposite the direction of processing shown in FIG. 5A).

Further, in one embodiment, the first server 552 may receive the event. As an option, the event may be processed by a first function (e.g. F1) on the first server 552. Further, as yet another option, a first result of the processing may be generated by the first function. As still yet another option, the first server 552 may send the first result to a second function (e.g. F2) on the fifth server 560.

Additionally, in another embodiment, the fifth server 560 may receive the first result from the first server 552. As an option, the first result may be processed by the second function on the fifth server 560. Further, as yet another option, a second result of the processing may be generated by the second function. As still yet another option, the fifth server 560 may send the second result to a third function (e.g. F3) on the fourth server 558.

In addition, in yet another embodiment, the fourth server 558 may receive the second result from the fifth server 560. As an option, the second result may be processed by the third function on the fourth server 558. Further, as yet another option, a third result of the processing may be generated by the third function. As still yet another option, the fourth server 558 may send the third result to a fourth function (e.g. F4) on the third server 556.

Furthermore, in still yet another embodiment, the third server 556 may receive the third result from the fourth server 558. As an option, the third result may be processed by the fourth function on the third server 556. Further, as yet another option, a fourth result of the processing may be generated by the fourth function. As still yet another option, the third server 556 may send the fourth result to a fifth function (e.g. F5) on the second server 554.

Further, in one embodiment, the second server 554 may receive the fourth result from the third server 556. As an option, the fourth result may be processed by the fifth function on the second server 554. Further, as yet another option, a fifth result of the processing may be generated by the fifth function. As still yet another option, the second server 554 may send the fifth result to a sixth function (e.g. F6) on the first server 552.

Additionally, in another embodiment, the first server 552 may receive the fifth result from the second server 554. As an option, the fifth result may be processed by the sixth function on the first server 552. Further, as yet another option, a sixth result of the processing may be generated by the sixth function. As still yet another option, since the sixth function is the last function, as illustrated, then the sixth result may be the final result for the processing flow of the event initially received at the first server 552. Additionally, as another option, the final result may be sent to a processing server. For example, the processing server may have sent the event to the first server 552.

In addition, in yet another embodiment, a similar processing flow is performed for the events received at the second server 554, the third server 556, the fourth server 558, and the fifth server 560. For example, the sixth functions of each server may generate the final result of processing for the received event. As yet another example, if the third function of the fourth server 558 is malfunctioning, then the final result generated by the sixth function of the first server 552 may be different than the final results generated by the sixth function of the other servers.

In one embodiment, the techniques described herein may be implemented in the context of virtual systems, virtual servers, and/or virtual processes. For example, in one embodiment, the servers referenced herein may include virtual servers and/or the functions may include functions associated with virtual processes.

The various embodiments described herein address a method of testing faults in a distributed system of event processing, by orchestrating a series of events so that they will be distributed among the various components of the distributed system. By analyzing the responses and results of the series of events it is possible to identify a faulty component of the system, thereby enabling a specific and exact fault handling to take place.

Recently, a strong trend towards virtualization of various computerized processing system has manifested. When analyzing the impact of cloud environments on the real-time testability of the systems, it becomes desirable that methods that worked in a static environment be altered and expanded to support the fault detection in the cloud. Today there are several intermediating layers of the virtual system and processes no longer are the 'residents' of a specific server. Operating teams do not have currently have a convenient technique to evaluate these virtual systems and processes.

By sending a series of planned events, in a quantity sufficiently large to cover the various paths the event is through, and analyzing the results of these events, it is possible, even though the processes are virtualized, to identify the malfunctioning process, and thus to enable correct handling of the fault.

In on embodiment, this mechanism may also be augmented to encompass any number of mid-way agents, relays, and proxies. By sending the events along the full path of the event, one receives indication as to the various components this event traversed until the response is received in the source.

The identification of the faulty process is based on the analysis of the events in an algorithm similar to that of convolution, where every combination of success/failure of the events points to a specific component with high probability.

A distributed system may be comprised of ($C_1 \ldots C_m$) components. Normally, processing an event is composed of traversing a sub-set of these components with various functionalities. In large systems, there are usually several components that are capable of doing the same type of processing. In such a topology, the number of possible paths a single event may traverse is a Cartesian multiplication of the number of components capable of executing each stage. This number may be extremely large, even for medium sized systems.

Accordingly, in one embodiment, a controlled list of events ($E_1 \ldots E_n$) may be sent into the system, distributed between all its entry points. The resulting set of responses may be collected, where a 'no answer' (time-out) is taken as a relevant answer for analysis.

The list of events may be controlled in a manner that will give different probabilities of passing through the various components. There will be several different events that will be processed at each of the components, but the probability of a large group of events to be processed by any two components is kept small.

By careful analysis of the results, they can point at a component (or virtual process) that functions worse than it should be. Due to the law of distribution given earlier, the events going through this faulty event create a unique sub-set of events out of the full list, and thus enable the system controller to identify the specific problematic process.

The number of controlled events to be used is a linear factor of the total number of components (and not that of all the combination), which is significantly lower than the number required by creating events for each path possible in the system. By analyzing only the results, using convolution technics, makes processing of the results relatively simple and straight forward. The vector-result of a series of events creates a 'signature' to which one can refer a set of probabilities of failures in the various components.

In this way, a faulty component or virtual process may be identified utilizing a probabilistic model. Moreover, the techniques described herein may function as an expansion from a static model of servers and processes, to a set of virtual components that replace the static set of servers. This is especially true in having a general BIT function for an End-to-End monitoring and fault detection and identification.

Figure 6:
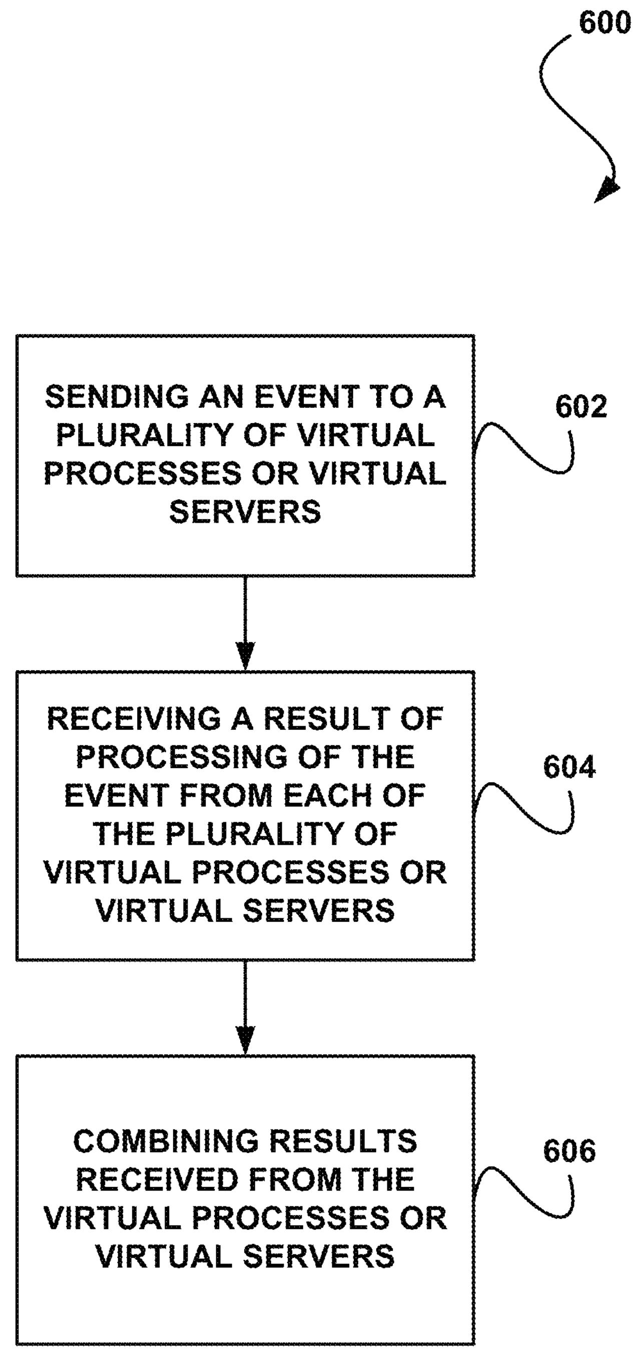
FIG. 6 illustrates a method for combining results of event processing received from a plurality of virtual processes or virtual servers, in accordance with one embodiment.

FIG. 6 illustrates a method 600 for combining results of event processing received from a plurality of virtual processes or virtual servers, in accordance with one embodiment. As an option, the method 600 may be carried out in the context of the details of the previous FIG. 2. Of course, however, the method 600 may be carried out in any desired environment. Further, the aforementioned definitions may equally apply to the description below.

As shown in operation 602, an event is sent to a plurality of virtual processes and/or virtual servers. In the context of the present description, the event may include any data capable of being sent to the plurality of virtual processes. As an option, the event may include an external message sent to the servers. Further, as yet another option, the external message may include a request, a command, an instruction, information, etc. In addition, as still yet another option, the event may include a data structure capable of being utilized by the virtual servers/virtual processes. For example, the virtual servers/virtual processes may utilize the event as a structured diagnosis tool.

Further, in one embodiment, sending the event may include communicating, transferring, forwarding, routing, etc., the event. As an option, the event may be sent utilizing a network. Optionally, the event may utilize a network protocol from an Internet protocol suite. For example, the Internet protocol suite may include a transmission control protocol (TCP), a user datagram protocol (UDP), an Internet protocol (IP), etc.

Further, in one embodiment, the event may be sent to the plurality of virtual servers/virtual processes as a batch. Optionally, the batch may include a separate event for each server/process associated with the plurality of virtual servers/virtual processes. For example, the number of separate events in the batch may be equal to the number of servers/processes.

In another embodiment, the event may be sent by another server. As an option, the other server may include a test server, a management server, a diagnostic server, a virtual server, etc. Further, as yet another option, the other server may send the event in response to a request. For example, after receiving a request, the test server may send the event to each server/process associated with the plurality of virtual servers/virtual processes.

In another embodiment, sending the event to the plurality of virtual processes/servers may include sending a controlled list of events to the at least one virtual system. In this case, sending the controlled list of events to the virtual system may include distributing the controlled list of events between all entry points associated with the virtual system.

In one embodiment, the controlled list of events may be controlled in a manner that will give different probabilities of passing through the plurality of virtual processes. Additionally, in one embodiment, a plurality of events may be processed at each of the plurality of virtual processes. In this case, the probability of a large group of events to be processed by any two of the plurality of the virtual processes may be kept small.

As shown in operation 604, a result of processing of the event from each of the plurality of virtual processes is received. Further, as shown in operation 606, the results received from the plurality of virtual processes are combined. In one embodiment, the method 600 may further include identifying a malfunctioning virtual process based on the combined results.

In one embodiment, each of the virtual processes may include a set of functions. In some cases, the set of functions associated with a first one of the virtual processes may be identical to the set of functions associated with each other one of the virtual processes. In these cases, the processing of the event may include utilizing the set of functions.

Further, in one embodiment, each of the plurality of virtual processes may be associated with a virtual server and the processing of the event may include cross virtual server processing. In one embodiment, the cross virtual server processing may utilize the event as an input to a first function of the set of functions. Further, the cross server processing may send an intermediate result for a first function of the set of functions to a second function of the set of functions.

In this case, the first function may be performed on the first one of the virtual servers and the second function may be performed on a second one of the virtual servers. Additionally, the intermediate result for the first function may be utilized as an input to the second function. Further, the received result of the processing may include a result of a last function of a set of functions.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A non-transitory computer readable medium storing computer code executable by a processor to perform a method comprising:

sending a plurality of events to a plurality of virtual processes, each virtual process of the plurality of virtual processes processing a received event of the plurality of events using a plurality of functions performed across a plurality of virtual servers specific to the virtual process, wherein the plurality of functions is identical across the plurality of virtual processes, wherein a first virtual process of the plurality of virtual processes processes a first event of the plurality of events in a first direction across the plurality of functions, and wherein a second virtual process of the plurality of virtual processes processes a second event of the plurality of events in a second direction across the plurality of functions, wherein the second direction is opposite the first direction, wherein a first function of the plurality of functions is performed on a first one of the virtual servers and a second function of the plurality of functions is performed on a second one of the virtual servers, wherein a result for the first function is utilized as an input to the second function when processing the first event in the first direction, and wherein a result of the second function is utilized as an input to the first function when processing the second event in the second direction;

receiving a first result of the processing of the first event from the first virtual process and a second result of the processing of the second event from the second virtual process;

combining the first result and the second result;

identifying a malfunctioning virtual process of the plurality of virtual processes based on the combined results.

2. The non-transitory computer readable medium of claim 1, wherein the plurality of events is sent by a test server to the plurality of virtual processes, and wherein the test server receives the first result and the second result and combines the first result and the second result.

3. The non-transitory computer readable medium of claim 1, wherein the malfunctioning virtual process produces a result that is different from a result produced by remaining virtual processes of the plurality of virtual processes.

4. The non-transitory computer readable medium of claim 1, wherein the plurality of events are sent to the plurality of virtual processes for testing faults in the plurality of virtual processes.

5. The non-transitory computer readable medium of claim 4, wherein the plurality of virtual processes form a distributed event processing system.

6. The non-transitory computer readable medium of claim 1, wherein identifying a malfunctioning virtual process of the plurality of virtual processes based on the combined results includes identifying a malfunctioning function of the plurality of functions based on the combined results.

7. The non-transitory computer readable medium of claim 1, wherein the first event indicates the first direction and the second event indicates the second direction.

8. The non-transitory computer readable medium of claim 1, wherein combining the first result and the second result includes summing the first result and the second result.

9. A method, comprising:

sending a plurality of events to a plurality of virtual processes, each virtual process of the plurality of virtual processes processing a received event of the plurality of events using a plurality of functions performed across a plurality of virtual servers specific to the virtual process, wherein the plurality of functions is identical across the plurality of virtual processes, wherein a first virtual process of the plurality of virtual processes a first event of the plurality of events in a first direction across the plurality of functions, and wherein a second virtual process of the plurality of virtual processes processes a second event of the plurality of events in a second direction across the plurality of functions, wherein the second direction is opposite the first direction, wherein a first function of the plurality of functions is performed on a first one of the virtual servers and a second function of the plurality of functions is performed on a second one of the virtual servers, wherein a result for the first function is utilized as an input to the second function when processing the first event in the first direction, and wherein a result of the second function is utilized as an input to the first function when processing the second event in the second direction;

receiving a first result of the processing of the first event from the first virtual process and a second result of the processing of the second event from the second virtual process;

combining the first result and the second result;

identifying a malfunctioning virtual process of the plurality of virtual processes based on the combined results.

10. A system, comprising:

a non-transitory memory storing instructions; and a processor in communication with the non-transitory memory that executes the instructions to perform a method comprising:

sending a plurality of events to a plurality of virtual processes, each virtual process of the plurality of virtual processes processing a received event of the plurality of events using a plurality of functions performed across a plurality of virtual servers specific to the virtual process, wherein the plurality of functions is identical across the plurality of virtual processes, wherein a first virtual process of the plurality of virtual processes a first event of the plurality of events in a first direction across the plurality of functions, and wherein a second virtual process of the plurality of virtual processes processes a second event of the plurality of events in a second direction across the plurality of functions, wherein the second direction is opposite the first direction, wherein a first function of the plurality of functions is performed on a first one of the virtual servers and a second function of the plurality of functions is performed on a second one of the virtual servers, wherein a result for the first function is utilized as an input to the second function when processing the first event in the first direction, and wherein a result of the second function is utilized as an input to the first function when processing the second event in the second direction;

receiving a first result of the processing of the first event from the first virtual process and a second result of the processing of the second event from the second virtual process;

combining the first result and the second result;

identifying a malfunctioning virtual process of the plurality of virtual processes based on the combined results.

11. The system of claim 10, wherein the processor is coupled to non-transitory memory via a bus.

* * * * *

UNITED STATES PATENT AND TRADEMARK OFFICE

CERTIFICATE OF CORRECTION

PATENT NO. : 11,599,438 B1
APPLICATION NO. : 15/357981
DATED : March 7, 2023
INVENTOR(S) : Omer Shani It is certified that error appears in the above-identified patent and that said Letters Patent is hereby corrected as shown below:

In the Claims

Column 14, Line 18 please replace “processes” with --processes processes--;

Column 14, Line 56 please replace “processes” with --processes processes--.

Signed and Sealed this
Thirtieth Day of December, 2025

John A. Squires
*Director of the United States Patent and Trademark Office*